United States Patent
Saitoh et al.

(10) Patent No.: US 7,173,424 B2
(45) Date of Patent: Feb. 6, 2007

(54) NUCLEAR MAGNETIC RESONANCE APPARATUS

(75) Inventors: Kazuo Saitoh, Kodaira (JP); Haruhiro Hasegawa, Kokubunji (JP); Hiroyuki Yamamoto, Kokubunji (JP); Hisaaki Ochi, Kodaira (JP); Tsuyoshi Wakuda, Hitachinaka (JP); Michiya Okada, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/196,279

(22) Filed: Aug. 4, 2005

(65) Prior Publication Data

US 2006/0033498 A1    Feb. 16, 2006

(30) Foreign Application Priority Data

Aug. 11, 2004    (JP)    ............................... 2004-234319

(51) Int. Cl.
    *G01V 3/00*    (2006.01)
(52) U.S. Cl. ...................................................... 324/318
(58) Field of Classification Search .................... None
    See application file for complete search history.

(56) References Cited

U.S. PATENT DOCUMENTS

| | | | |
|---|---|---|---|
| 5,247,256 A | | 9/1993 | Marek |
| 5,481,191 A | * | 1/1996 | Rzedzian ..................... 324/318 |
| 5,572,127 A | * | 11/1996 | Wong et al. ................. 324/315 |
| 5,572,131 A | * | 11/1996 | Rzedzian ..................... 324/318 |
| 5,585,723 A | | 12/1996 | Withers |
| 5,689,187 A | * | 11/1997 | Marek et al. ................ 324/318 |
| 6,144,204 A | * | 11/2000 | Sementchenko ............ 324/318 |
| 6,411,092 B1 | * | 6/2002 | Anderson .................... 324/319 |
| 6,552,545 B2 | * | 4/2003 | Kaindl et al. ................ 324/318 |
| 2006/0119360 A1 | * | 6/2006 | Yamamoto et al. ......... 324/318 |

FOREIGN PATENT DOCUMENTS

| | | |
|---|---|---|
| EP | 1 239 297 | 9/2002 |
| EP | 1 279 967 | 1/2003 |
| EP | 1 486 793 | 12/2004 |
| JP | 11-133127 | 5/1999 |
| JP | 2005-87229 | * 4/2005 |
| WO | WO03/029834 | 4/2003 |

* cited by examiner

*Primary Examiner*—Diego Guterrez
*Assistant Examiner*—Dixomara Vargas
(74) *Attorney, Agent, or Firm*—Antonelli, Terry, Stout & Kraus, LLP.

(57) ABSTRACT

A configuration of an NMR apparatus is provided. In the NMR apparatus, a magnetic field space of higher uniformity is generated by split superconducting magnets. At the same time, it is provided with a cryo probe excellent in cooling capability and sensitivity between two superconducting solenoid coils constructed in very close proximity to each other. For this purpose, a probe coil provided between the two superconducting solenoid coils is so constructed that the following is implemented: a certain distance is ensured between a substrate with a coil formed thereon and another, and the substrates and spacer substrates for cooling are alternately laminated. The spacer substrates are cooled by a cold head of sapphire. When the probe coil is inserted in the same direction as a sample tube (direction perpendicular to the static magnetic field), the spacer substrates cannot be coupled directly by the cold head of sapphire. Therefore, they are cooled through a fixed substrate for thermal conduction of sapphire coupled with the cold head.

15 Claims, 13 Drawing Sheets

NUCLEAR MAGNETIC RESONANCE APPARATUS

CLAIM OF PRIORITY

The present application claims priority from Japanese application JP2004-234319 filed on Aug. 11, 2004, the content of which is hereby incorporated by reference into this application.

FIELD OF THE INVENTION

The present invention relates to a nuclear magnetic resonance apparatus (hereafter, represented as "NMR apparatus"), and more particularly to an NMR apparatus characterized in the shape of a probe coil for transmitting a high-frequency signal to a sample placed in a predetermined uniform magnetic field ($B_0$) with a predetermined resonance frequency and/or receiving a free induction decay (FID) signal and its construction for mounting.

BACKGROUND OF THE INVENTION

Nuclear magnetic resonance (NMR) measurement can be implemented by measuring response signals from atomic spins that constitute substances. The NMR measurement is an ultimate measuring technique that makes it possible to obtain microscopic information about substances. The basic principle behind the NMR measurement is as follows: a high-frequency magnetic field is applied to a sample placed in a uniform magnetic field. The response signals from spins thereby excited are received and analyzed. As a result, the properties of various substances can be measured. Conventionally, the NMR measurement has been used for studying solid state properties.

Recently, magnets that generate uniform high magnetic fields have been used for the enhancement of the resolution of NMR measurement. As a result, it has been made possible to clarify protein structures that are very difficult to measure with other measuring techniques. In general, a superconducting magnet is used to obtain a magnetic field of 10 tesla (T) or above. Presently, NMR apparatuses of 21.6 T (920 MHz) have been fabricated and in operation for the purpose of analyzing protein structures.

To accomplish high-resolution NMR measurement, the uniformity of magnetic field is one of the critical factors. In the above-mentioned protein structure analysis, in general, a uniformity of $10^{-9}$ or below is required in a space in which a sample as a measuring object exists.

In the protein structure analysis, response signals (free induction decay signals, FID signals) from a sample are extremely weak. To efficiently receive such signals, a high-sensitivity reception system is required. Especially, the enhancement of the sensitivity of probe coils (antenna elements) that receive signals is a technical challenge the solving of which is indispensable to NMR measuring apparatuses. Application of a probe coil using a superconducting material whose resistance to high-frequency currents is extremely low is effective in solving this challenge. Superconducting materials are lower in resistance to high-frequency currents by two orders of magnitude or more than ordinary normal-conducting materials (e.g. metallic materials such as copper and gold). Therefore, resistive loss in a reception coil can be remarkably reduced, and the enhancement of sensitivity is accomplished.

To accomplish the enhancement of sensitivity using superconducting material, a probe coil formed of superconductor must be placed in a low-temperature environment. To realize a low-temperature environment, the apparatuses must be provided with a cooling mechanism. If this cooling mechanism is used to cool a semiconductor amplifier connected to the stage subsequent to the probe coil, the sensitivity of the entire reception system can be further enhanced.

From the above-mentioned viewpoints, the following are important to realize an NMR measuring apparatus characterized in its high resolution and high sensitivity: ensuring a uniform magnetic field in a sample space, and adopting a probe coil formed of superconducting material. An NMR measuring apparatus provided with a cooling mechanism and a superconducting probe coil is described in Patent Document 1. Application of a superconducting coil is described in Patent Document 2 and Patent Document 3.

In the above-mentioned conventional technologies, superconducting solenoid coils are set (installed) to ensure the above-mentioned uniformity of high magnetic field. For this reason, bird cage or saddle is adopted for the shape of a probe coil. This is for the purpose of suppressing the uniformity of magnetic field from being disturbed by the perfect diamagnetism of superconductor. When a saddle or bird cage probe coil is formed of superconductor, especially, high-temperature superconductor to reduce the noise in the probe coil, the following problem arises: a superconducting film formed on a flat oxide single crystal substrate is utilized; therefore, the shape cannot be freely selected, and it is difficult to efficiently cover a sample. Though the noise in the coil caused by resistance can be reduced, as a result, the following problem arises: reduction in the filling factor related to shape lowers the efficiency of application of high-frequency signals.

Adoption of solenoid probe coil is a promising measure to further enhance the sensitivity of NMR measurement. Solenoid probe coils make it possible to further enhance the filling factor than conventional bird cage-shaped coils. As a result, the enhancement of sensitivity can be accomplished. A solenoid probe coil must be installed so that the direction of its central axis is orthogonal to a static magnetic field. Therefore, if a solenoid probe coil is inserted into a conventionally used integral-type superconducting solenoid coil that generates a uniform magnetic field, a space in which a measurement sample is to be placed cannot be ensured. Consequently, to use a solenoid probe coil, such a constitution that a uniform superconducting magnet that generates a magnetic field is split must be adopted.

[Patent Document 1] Specification of U.S. Pat. No. 5,247,256

[Patent Document 2] Specification of U.S. Pat. No. 5,585,723

[Patent Document 3] Japanese Patent Laid-Open No. H 11(1999)-133127

SUMMARY OF THE INVENTION

An object of the present invention is to provide an NMR apparatus wherein the enhancement of the sensitivity of a probe coil that receives free induction decay (FID) signals in nuclear magnetic resonance (NMR) spectroscopy is accomplished. To realize a high-sensitivity NMR measuring apparatus, the following items are required: two independent superconducting solenoid coils (split superconducting magnets) for generating a uniform magnetic field; and a solenoid probe coil obtained by processing superconducting material. To generate a magnetic field space of higher uniformity with split superconducting magnets in this constitution, such a configuration that the following is implemented must be adopted: two superconducting solenoid coils are placed in very close proximity to each other. The distance between the two superconducting solenoid coils must be sufficient to ensure a space for installing a probe coil as well as a space for inserting a sample tube into the probe coil.

Two methods can be used to provide a probe coil between two superconducting solenoid coils. One is a method in which it is inserted in the same direction as the sample tube (direction perpendicular to the static magnetic field). The other is a method in which it is inserted in parallel with the static magnetic field, that is, inserted through the bore in a superconducting solenoid coil. In either case, the sample tube is inserted into the probe coil. Therefore, to determine the distance between the two superconducting solenoid coils, consideration must be given to the size of the probe coil into which the sample tube is to be inserted.

If the probe coil is formed of superconducting material, a cooling mechanism is additionally required. A more detailed object of the present invention is to provide the configuration of an NMR apparatus provided with a cooling mechanism and the configuration of a probe for laterally inserting the probe, as well as applying a high-frequency magnetic field and receiving FID signals, with the following taken into account: thermal conduction cooling, electrical connection, and ease of construction.

According to the present invention, the following constitution is adopted to realize a high-sensitivity NMR apparatus: to generate a uniform high magnetic field ($B_0$), split superconducting magnets obtained by dividing a superconducting magnet into two are adopted.

A probe coil (transmitting probe coil) that applies a high-frequency signal of resonance frequency is provided in the area of uniform high magnetic field between the split superconducting magnets. In addition, a probe coil (receiving probe coil) is provided for receiving a nuclear magnetic resonance signal from a sample in response to the applied high-frequency signal. To accomplish high-sensitivity NMR measurement, the receiving probe coil is constructed as follows: solenoid coils obtained by forming a superconducting thin film on a sapphire substrate are used as element coils. The plurality of element coils are laminated, and the element coils are electrically connected with one another to form a required coil. A spacer substrate of sapphire is provided between the substrates on which the respective element coils are formed. Electrical connection between the element coils is carried out using a metal (e.g. indium) that is fused by appropriately raising temperature and makes it possible to easily weld together metal foil members of gold, silver, copper, or the like.

In some cases, the function of transmitting probe coil and that of receiving probe coil may be carried out by one solenoid superconducting probe coil. Aluminum nitride (AlN) may be used for the spacer substrates in place of sapphire.

The cooling mechanism is constructed as follows: a member of oxygen free copper, a member of sapphire, or a member of a combination of them is connected to a heat exchanger or immersed in liquid helium and thereby cooled; and a cold head formed of sapphire is connected to this member. The above-mentioned probe coil is coupled with the cold head, and the probe coil is thereby cooled.

When the probe coil is disposed by the method in which it is inserted in the same direction as the sample tube (direction perpendicular to the static magnetic field), cooling is carried out as follow: a fixed substrate for thermal conduction of sapphire, coupled with the spacer substrates between the substrates with the individual element coils formed thereon is coupled with the cold head. When the probe coil is disposed by the method in which it is inserted through the bore in a split superconducting magnet, cooling is carried out as follows: the spacer substrates between the substrates with the individual element coils formed thereon are directly coupled with the cold head.

DESCRIPTION OF THE PREFERRED EMBODIMENTS

The present invention relates to a nuclear magnetic resonance (NMR) apparatus. More particularly, it relates to a superconducting thin film coil in a probe and a configuration for mounting. The probe is for transmitting high-frequency signals to a sample placed in a uniform magnetic field with a predetermined resonance frequency, and for receiving free induction decay (FID) signals.

Figure 1A:
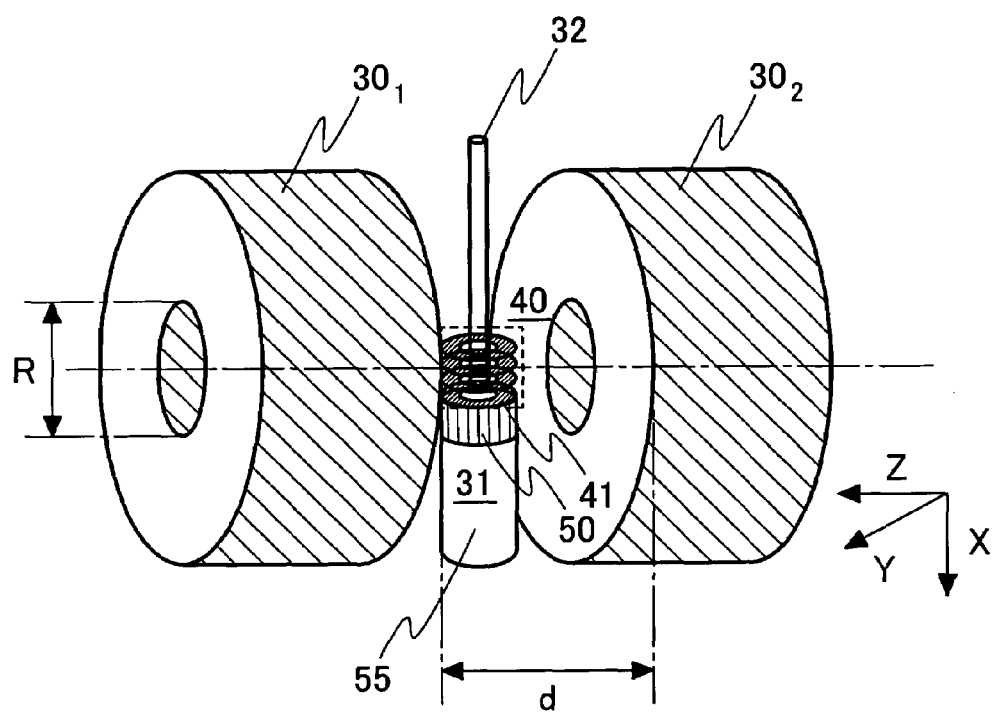
FIG. 1A is a perspective view roughly illustrating the principal part of an NMR apparatus according to the present invention. The figure illustrates an example in which a probe coil is disposed by the method in which it is inserted in the same direction as a sample tube (direction perpendicular to the static magnetic field).
Figure 1B:
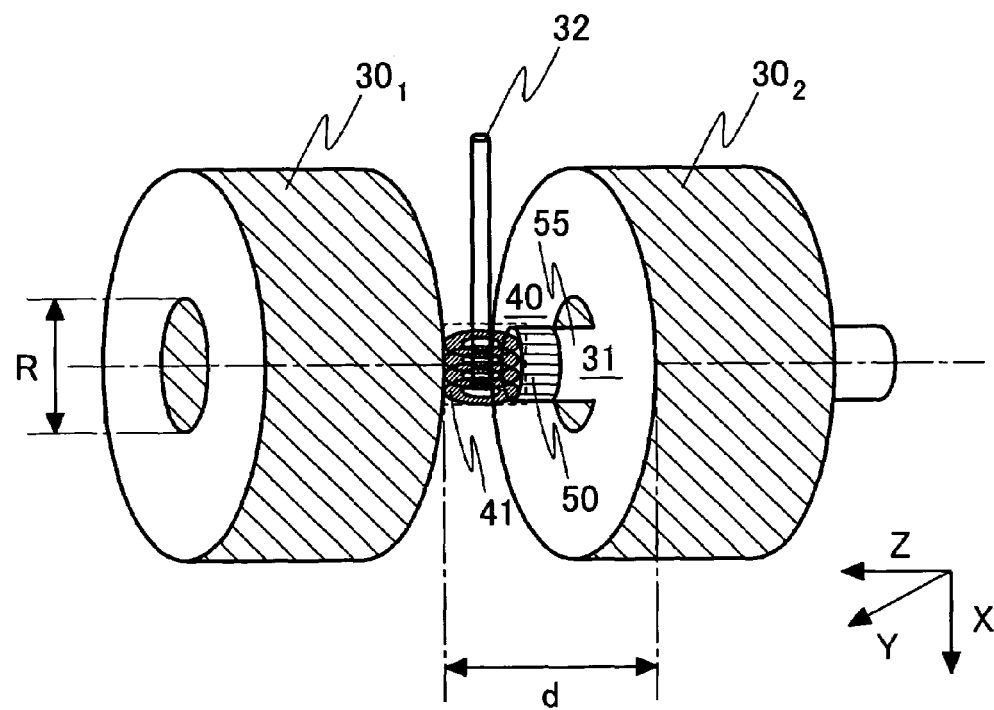
FIG. 1B is a perspective view roughly illustrating the principal part of an NMR apparatus according to the present invention. The figure illustrates an example in which a probe coil is disposed by the method in which it is inserted through the bore in a split superconducting magnet.

Description will be given to a representative configuration of an NMR apparatus according the present invention with reference to FIGS. 1A and 1B. FIG. 1A is a perspective view roughly illustrating the principal part of an NMR apparatus according to the present invention. The figure illustrates an example in which a probe coil is disposed by the method in which it is inserted in the same direction as a sample tube (direction perpendicular to the static magnetic field). FIG. 1B is a perspective view roughly illustrating the principal part of an NMR apparatus according to the present invention. The figure illustrates an example in which a probe coil is disposed by the method in which it is inserted through the bore in a split super conducting magnet. A uniform magnetic field (static magnetic field) of 14.1 tesla (T) is generated along the center line, indicated by alternate long and short dash line, by the two split superconducting magnets $30_1$ and $30_2$. A sample tube 32 is inserted in the direction perpendicular to the static magnetic field (direction of the x axis in the figure). A cryo probe 31 mounted with a solenoid superconducting probe coil (antenna coil) 40 for detecting signals from a sample is inserted in the same direction as the sample tube 32 (FIG. 1A). Or, it is inserted in the same direction as the static magnetic field (FIG. 1B).

The cryo probe 31 comprises: the superconducting solenoid coil 40 formed by laminating four layers of substrates (not shown) with a superconducting one-turn coil 41 (element coil) formed on each of them to obtain a two-turn, two-parallel coil; a cold head 50 of sapphire that transfers cold thereto; and a cold lead 55 of oxygen free copper that connects the cold head 50 and an end of a cryocooler that functions as a cryo cooling system. With respect to the present invention, the portion including the following items will be designated as a cryo probe: the probe coil 40; the cold head 50 of sapphire that transfers cold thereto; and an end of the cold lead 55 of oxygen free copper that connects the cold head 50 and the end of the cryocooler that functions as a cryo cooling system.

The construction illustrated in FIG. 1A and that illustrated in FIG. 1B have respectively advantages and drawbacks in terms of NMR measurement and the fabrication and mounting of the apparatus.

From the viewpoint of suppressing disturbance in a uniform magnetic field, the construction illustrated in FIG. 1A is more advantageous than that illustrated in FIG. 1B because of the symmetric property of cylindrical shaft. With the construction illustrated in FIG. 1A, the cryo probe 31 is installed in the direction perpendicular to the static magnetic field. With the construction illustrated in FIG. 1B, the cryo probe is inserted in the same direction as the static magnetic field. However, the gap (d in the figures) between the superconducting magnets $30_1$ and $30_2$ required for mounting the cryo probe 31 is larger in FIG. 1A than in FIG. 1B.

Consideration will be given from the viewpoint of cooling the superconducting thin films forming the probe coil 40. With the construction illustrated in FIG. 1A, the distances between the layers of the element coils 41 and the cold head 50 are not identical. Therefore, to uniformly transfer the cold of the cold head 50 to the layers of the element coils 41 as much as possible, the following device, for example, is required: a fixed substrate for thermal conduction of sapphire, coupled with the spacer substrates between the substrates with the respective element coils 41 formed thereon is provided, and it is coupled with the cold head to provide cooling. With the construction illustrated in FIG. 1B, the spacer substrates between the substrates with the respective element coils formed thereon can be directly coupled with the cold head and cooled. As a result, the construction can be simplified.

Figure 2A:
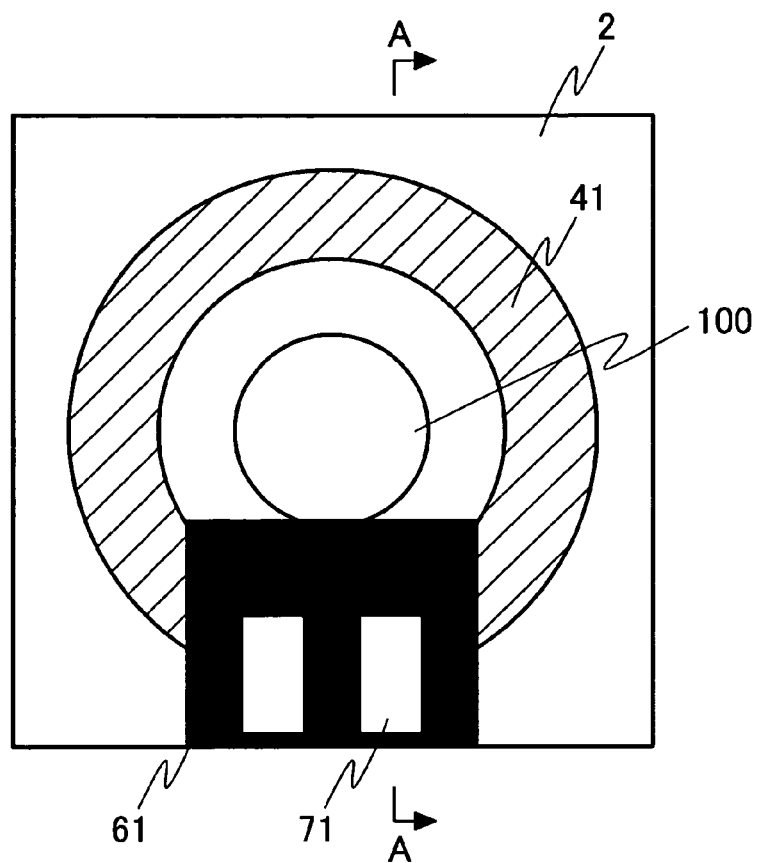
FIG. 2A is a top view of an element coil (reception coil) formed of a superconducting thin film.
Figure 2B:
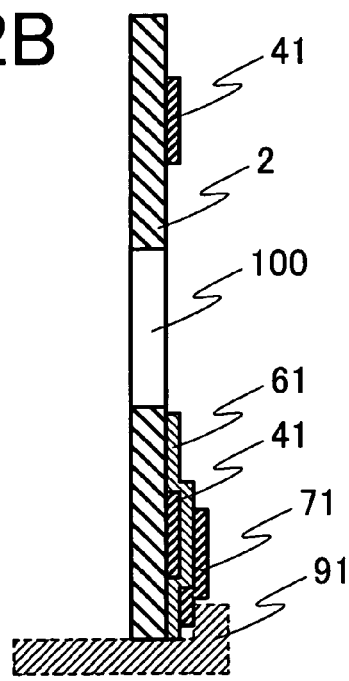
FIG. 2B is a sectional view taken along the line A—A of FIG. 2A, as viewed in the direction of the arrows.

FIG. 2A is a top view of an element coil (reception coil) formed of a superconducting thin film, and FIG. 2B is a sectional view taken along the line A—A of FIG. 2B, as viewed in the direction of the arrows. In the present invention, as the superconducting material used for the superconducting thin film coil, oxide high-temperature superconducting material ($YBa_2Cu_3O_8$, hereafter, represented as "YBCO") or magnesium diboride ($MgB_2$) was used. Hereafter, description will be given to formation methods for thin films of these materials and a fabrication method for thin film coils.

Numeral 2 denotes a sapphire substrate, and 41 denotes an element coil formed on the sapphire substrate 2, which is of yttrium barium copper oxide (YBCO), an oxide high-temperature superconducting material. The permittivity of the sapphire substrate 2 is 10 or so even at a low temperature, and the sapphire substrate is suitable for application to high-frequency elements. However, it is difficult to form a YBCO thin film, excellent in crystal orientation, directly on a substrate because of mismatching of lattice spacing. Consequently, cerium oxide ($CeO_2$) of 50 nm thickness is deposited as a buffer layer on the substrate 2 by a laser aberration method, though the layer is not shown in the figure. Thereafter, a YBCO thin film of 200 nm thickness is similarly deposited by a laser aberration method. The thus obtained superconducting thin film is excellent in crystal orientation, and its superconducting critical temperature is 90K.

As illustrated in FIG. 2A, the superconducting thin film is patterned into washer shape by photo lithography and electron-cyclotron-resonance etching to obtain a one-turn coil. Thereafter, a $CeO_2$ thin film 61 as an insulating layer is deposited only in the area at an end of the one-turn coil by a sputtering method using a metal mask. Thereafter, a gold thin film is similarly deposited on the upper face of the $CeO_2$ thin film 61 by a sputtering method using a metal mask. Subsequently, patterning is carried out by photo lithography and electron-cyclotron-resonance etching so that only the portion of the gold thin film 71 corresponding to the area at the end of the one-turn coil is left, and the thin film is processed into desired shape.

By the above-mentioned steps of processing, the one-turn coil with a thin film capacitor of Au/CeO/YBCO layered structure formed at its end is formed on the face of the substrate 2. Last, the substrate 2 is perforated to form a hole 100 through which a sample tube 32 is to be passed. The hole in the substrate is formed by laser light irradiation. To form a solenoid coil, a plurality of element coils (one-turn coils) 41 must be laminated as required, and the coils must be electrically connected with one another. In the solenoid coil using a superconducting thin film according to the present invention, the one-turn coils are connected through the capacitors formed at their ends. The hatched portion marked with numeral 91 is a gold thick film, and it functions as a connection wire for connecting the one-turn coils through the capacitors formed at their ends.

Also, in case magnesium diboride ($MgB_2$) is used for superconducting material, the one-turn coils can be formed similarly with the above-mentioned steps of processing. In this case, however, aluminum nitride AlN is used for insulating material in place of $CeO_2$.

Figure 3:
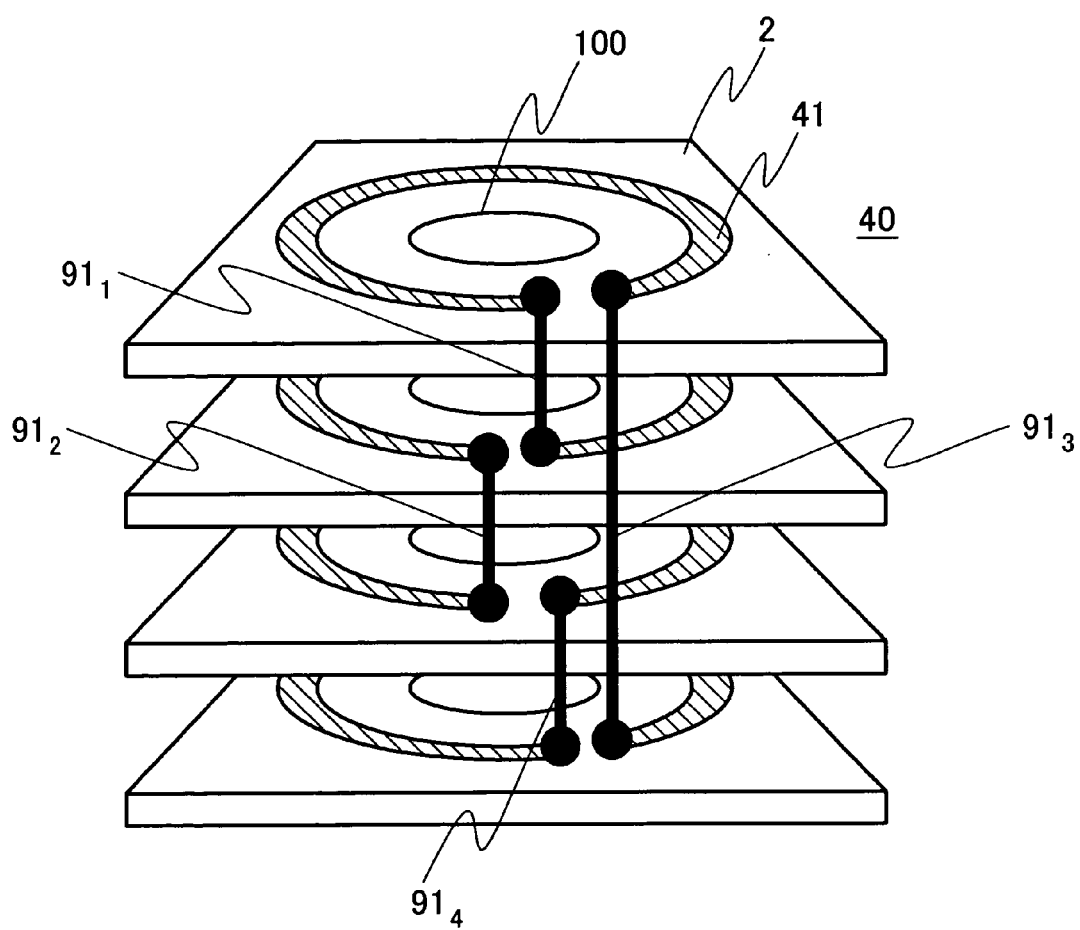
FIG. 3 is a conceptual rendering illustrating how four element coils (one-turn coils) 41 are laminated to form a two-turn, two-parallel solenoid coil.

FIG. 3 is a conceptual rendering illustrating how four element coils (one-turn coils) 41 are laminated to from a two-turn, two-parallel solenoid coil. The black circles shown at ends of one-turn coils 41 formed on the upper faces of sapphire substrates 2 represent capacitors formed at the ends of the one-turn coils. Numerals $91_1$ to $91_4$ denote gold thick films that function as connection wires for electrically connecting the capacitors together. The two sets of the two one-turn coils 41 connected together through connection wires $91_1$ and $91_4$ are respectively two-turn coils connected in serial. Both ends of them are connected through connection wires $91_2$ and $91_3$ to form a two-turn, two-parallel solenoid coil.

Description has been given with a two-turn, two-parallel solenoid coil taken as an example. A four-turn, one-parallel solenoid coil and one-turn, four-parallel solenoid coil can be easily realized by changing the connecting positions of the connection wires 91.

(First Embodiment—Example of Configuration in which a Cryo Probe 31 is Installed in the Direction Perpendicular to the Static Magnetic Field)

To carry out NMR measurement in the high-frequency band ranging from 300 MHz to over 1 GHz, the construction and mounting of the following solenoid coil were considered: a sample, 3 to 10 mm in diameter and 5 to 10 mm in length, is taken as a measuring object. The solenoid coil using a superconducting thin film is used to apply a magnetic field to the sample placed in the sample tube 32 and to receive free induction decay (FID) signals.

Figure 4:
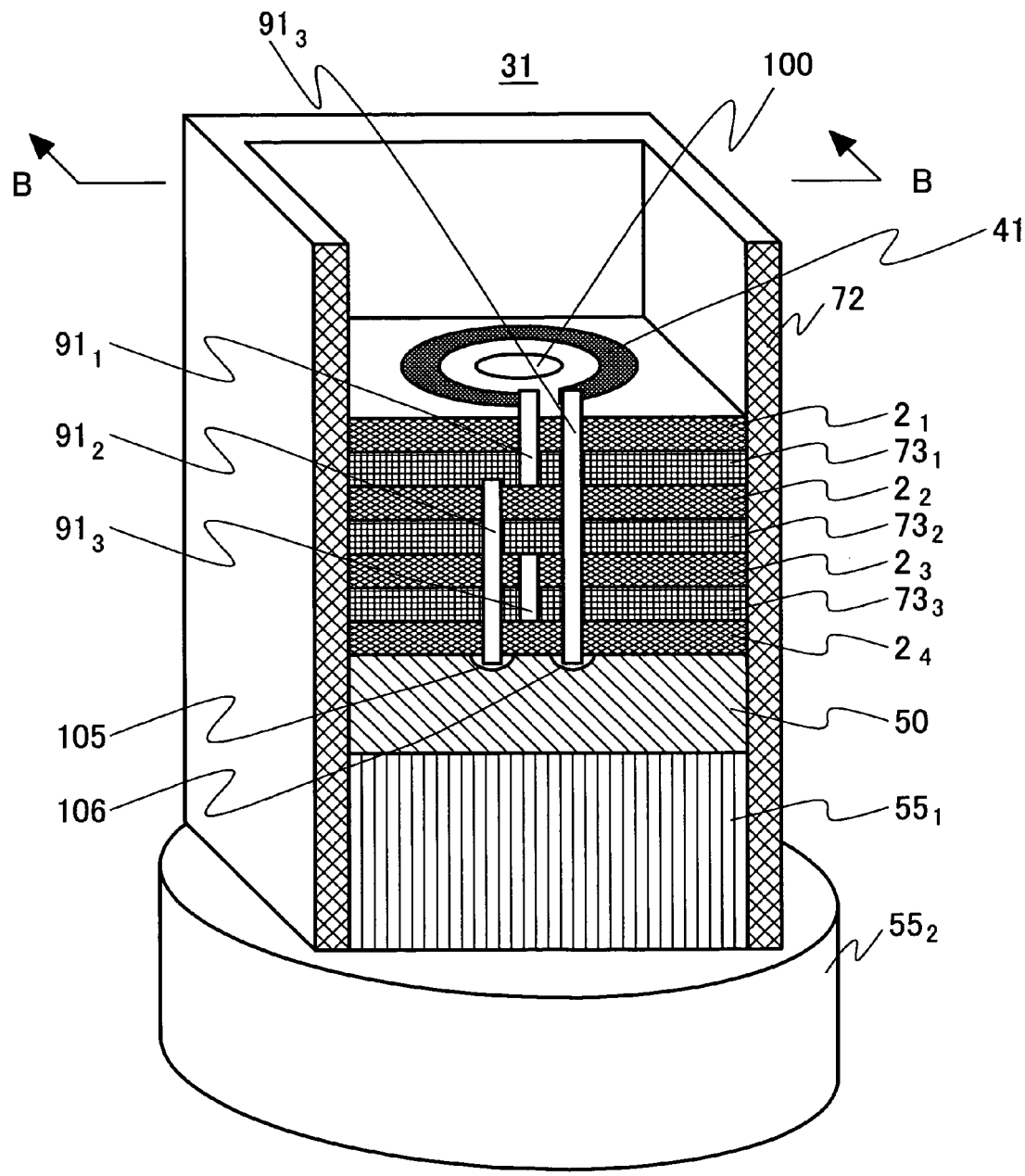
FIG. 4 is a side view of a cryo probe 31 so constructed that the cryo probe 31 is installed in the direction perpendicular to the static magnetic field. The figure illustrates the cryo probe with one side face of a fixed substrate 72 for thermal conduction of sapphire removed.
Figure 5:
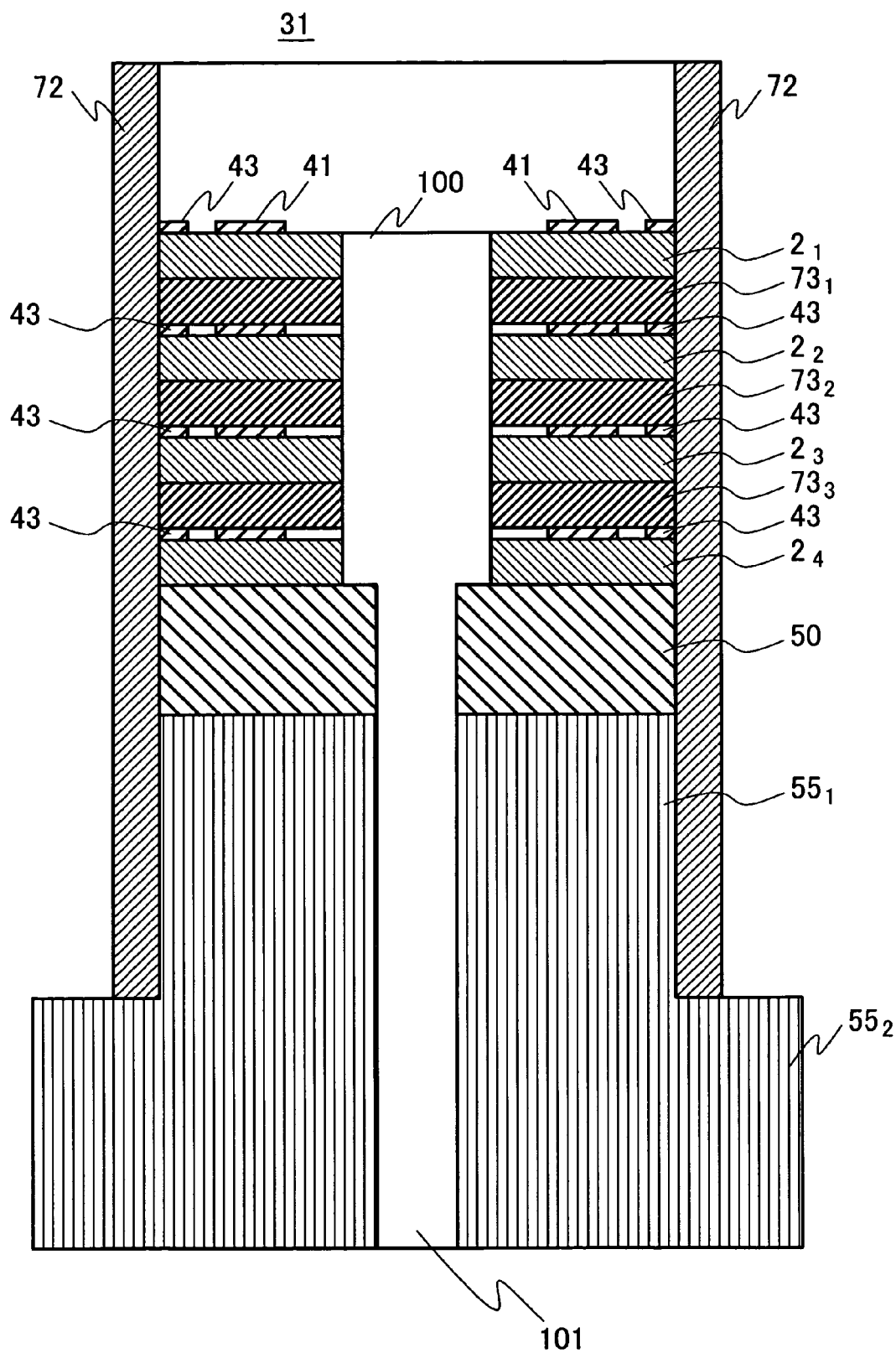
FIG. 5 is a sectional view taken along the line B—B of FIG. 4, as viewed in the direction of the arrows.

FIG. 4 is a side view illustrating a cryo probe 31 so constructed that the cryo probe 31 is installed in the direction perpendicular to the static magnetic field. The figure illustrates the cryo probe with one side face of a fixed substrate 72 for thermal conduction of sapphire removed. FIG. 5 is a sectional view taken along the line B—B (at the center of a hole 100 into which a sample tube 32 is to be passed) of FIG. 4, as viewed in the direction of the arrows.

An end $55_1$ of a cold lead 55 of oxygen free copper to be connected with an end of a cryocooler is formed in the same size as substrates 2. A cold head 50 of sapphire is formed on its upper face. A substrate $2_4$ of sapphire with an element coil 41 formed thereon is disposed on the upper face of the cold head 50. A substrate $2_3$ of sapphire is disposed on the upper face of the substrate $2_4$ with a spacer substrate $73_3$ of sapphire in-between. Similarly, a substrate $2_2$ of sapphire is disposed on the upper face of the substrate $2_3$ with a spacer substrate $73_2$ of sapphire in-between; a substrate $2_1$ of sapphire is disposed on the upper face of the substrate $2_2$ with a spacer substrate $73_1$ of sapphire in-between. In the process of laminating the substrates 2, wires $91_1$ to $91_4$ that connect together the element coils 41 on the substrates 2 and wires for externally leading them out are electrically connected. A cut is formed in each spacer substrate 73 in positions corresponding to the wires 91 illustrated in FIG. 2. These cuts are so formed that, when the spacer substrates 73 and the substrates 2 of sapphire are laminated, both can be disposed in parallel with each other. This is the same in the other embodiments. A hole 100 through which a sample tube 32 is to be passed is formed in the spacer substrates 73 as well as the substrates 2.

In this example, as described with reference to FIG. 3, the probe coil 40 is constructed as a two-turn, two-parallel probe coil. Therefore, the wires connected with the wires $91_2$ and $91_3$ are connected with the following wires: wires led from the cuts 105 and 106 connecting to a lead-out hole 101 formed in the center of the end $55_1$ of the cold lead 55 and the cold head 50. When connection between the element coils 41 on the substrates 2 and lamination of the substrates 2 are completed, a fixed substrate 72 for thermal conduction is provided. The fixed substrate 72 for thermal conduction encircles the end $55_1$ of the cold lead 55, the cold head 50, and the laminated portions of the substrates 2 and the spacer substrates 73.

In FIG. 4, the representation of the laminated portions of the substrates 2 and the spacer substrates 73 is omitted for avoiding the complication of the figure. However, FIG. 5 shows the following relation in the form of sectional view for clarification: the relation between the laminated portions, the substrates 2 and the spacer substrates 73, and the fixed substrate 72 for thermal conduction.

When the substrate 24 is laminated on the end of the cold head 50, the operation is performed so that both are brought into tight contact and can be welded together by indium. When the spacer substrate $73_4$ of sapphire is laminated on the upper face of the substrate $2_4$, indium 43 is placed in the peripheral area of the substrate $2_4$ except the plane on which the wires 91 are formed. Thus, the substrate $2_4$ and the spacer substrate $73_3$ of sapphire can be bonded together. When the substrate $2_3$ is laminated on the upper face of the spacer substrate $73_3$ of sapphire over the substrate $2_4$, the operation is performed similarly with when the substrate $2_4$ is laminated on the end of the cold head 50. That is, the operation is performed so that both are brought into tight contact and can be welded together by indium. The substrates and the spacer substrates are laminated in succession. Thereafter, the laminated portions of the substrates 2 and the spacer substrates 73, the cold head 50, and the end $55_1$ of the cold lead 55 are encircled with the fixed substrate 72 for thermal conduction. The thus constructed cryo probe 31 is heated in an oven at 200° C. to 300° C. for 10 minutes to 30 minutes to fuse the applied indium.

As is apparent from FIG. 5, the fixed substrate 72 for thermal conduction is in contact with the end $55_1$ of the cold lead 55 and the cold head 50. Therefore, the fixed substrate 72 for thermal conduction can be cooled down to 5K. Further, the spacer substrates 73 are inserted into between the substrates 2 with the element coils 41 formed thereon. The substrates 2 are welded together and the substrates 2 and spacer substrates 73 and the fixed substrate 72 for thermal conduction are welded together by indium. This increases the areas of contact between the peripheral portions of the substrates 2 and spacer substrates 73 and the fixed substrate 72 for thermal conduction, and efficient cooling can be implemented. As a result, the entire solenoid coil is cooled down to approximately 5K, and the stable operation of the probe coil 40 can be accomplished.

Insertion of the spacer substrates 73 is effective in setting the overall dimensions of the solenoid coil so that the solenoid coil sufficiently covers a sample. Also, it is effective in making the construction robust.

The fabricated probe coil 40 was evaluated at 600 MHz. The result of the evaluation revealed that application of a superconducting thin film enhances the sensitivity by 3.5 times than cases where normal-conducting metal is used.

In the above-mentioned embodiment, YBCO is used for the superconducting thin film material. When $MgB_2$ was used for the superconducting thin film material with the same configuration as well, the same result was obtained. It is obvious that, even if Nb, Pb, NbTi, or an alloy of them is used for the superconducting thin film material, the same result will be obtained.

For the fixed substrate 72 for thermal conduction and the spacer substrates 73, sapphire substrates were processed and used. When the fixed substrate 72 for thermal conduction and the spacer substrates 73 were fabricated using aluminum nitride AlN as well, the same result was obtained.

(Second Embodiment—Example of Configuration in which a Cryo Probe 31 is Installed in the Direction Perpendicular to the Static Magnetic Field)

Figure 6A:
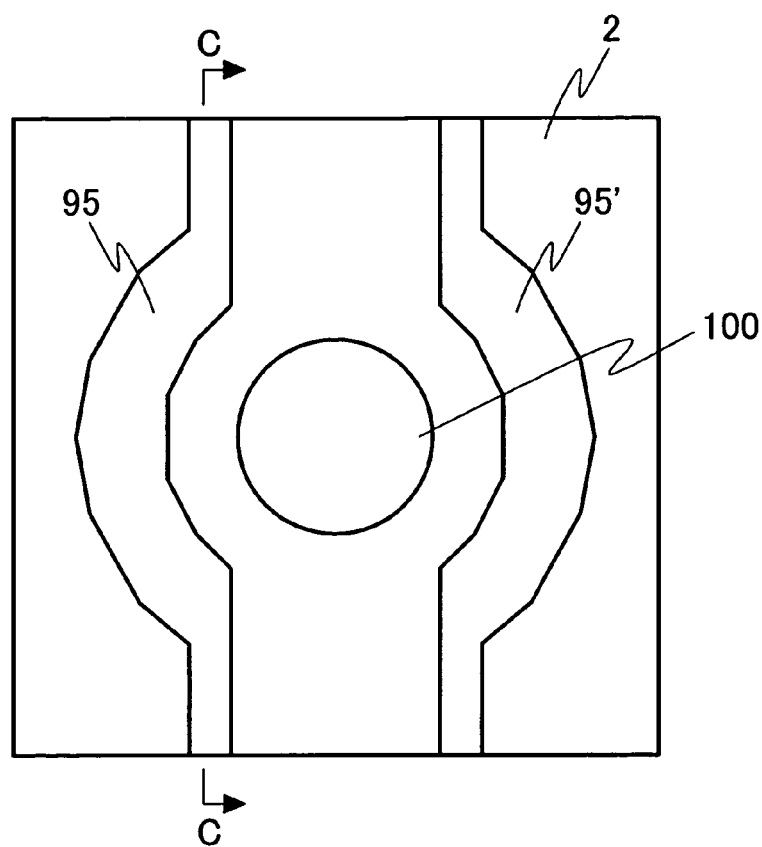
FIG. 6A is a top view of a transmission coil formed of an oxygen free copper thin film.
Figure 6B:
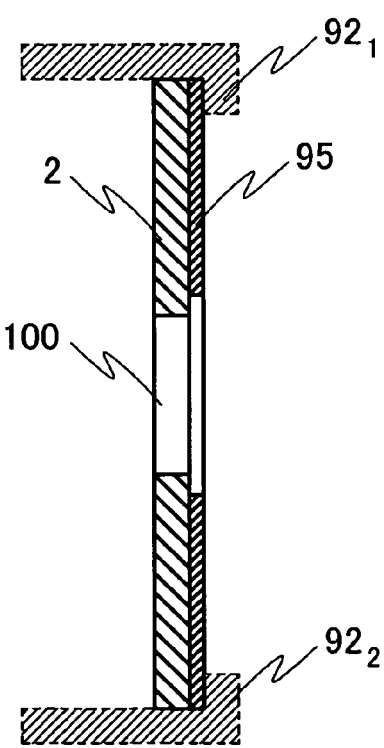
FIG. 6B is a sectional view taken along the line C—C of FIG. 6A, as viewed in the direction of the arrows.

FIG. 6A is a top view of a transmission coil formed of an oxygen free copper thin film. FIG. 6B is a sectional view taken along the line C—C of FIG. 6A, as viewed in the direction of the arrows. Numeral 2 denotes a sapphire substrate, and 95 and 95' denote oxygen free copper thin films. The oxygen free copper thin film 95 is formed on the sapphire substrate 2 in the same manner as of the reception coil. After the formation of the oxygen free copper thin film 95, the substrate 2 is perforated to form a hole 100 through which a sample tube 32 is to be passed. The hole in the substrate is formed by laser light irradiation. Numerals $92_1$ and $92_2$ denote wires described later.

Figure 7:
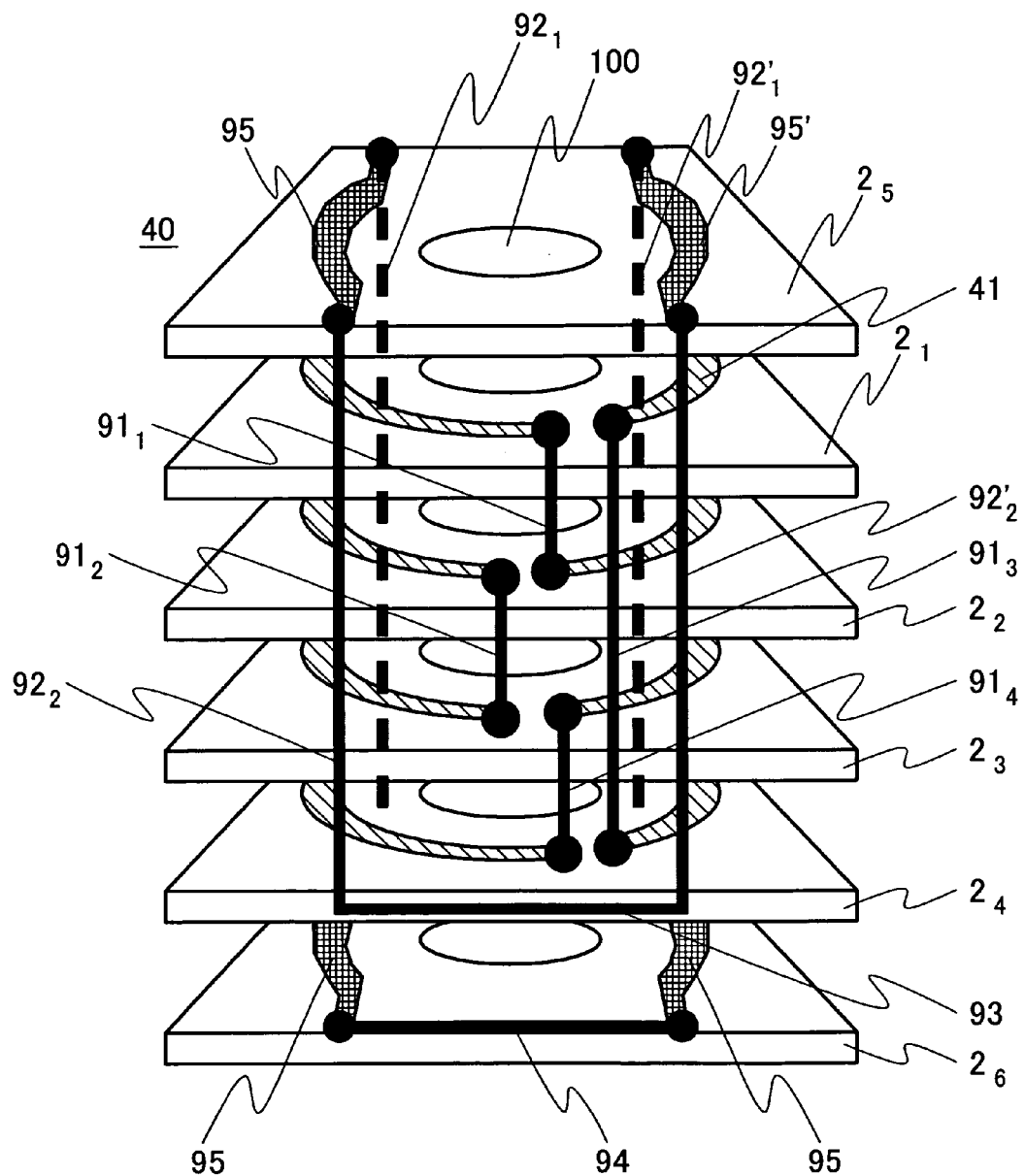
FIG. 7 is a drawing roughly illustrating the configuration of a probe coil 40 formed by combining transmission coils and reception coils.

FIG. 7 is a drawing roughly illustrating the configuration of a probe coil 40 formed by combining transmission coils and reception coils. The oxygen free copper thin films 95 and 95' formed on the sapphire substrates 2 are so disposed so that the reception coils formed on the laminated substrates 2, described with reference to FIGS. 4 and 5, are sandwiched between their upper faces and lower faces. At the same time, required wires are installed and the probe coil is so constructed that the reception coils are encircled with one-turn saddle coils. More specific description will be given. One ends of the oxygen free copper thin films 95 and 95' on the substrate 2 at the uppermost level are connected with one ends of the oxygen free copper thin films 95 and 95' on the substrate 2 at the lowermost level. This connection is carried out through wires $92_1$ and $92_1'$ on the far side of the figure. The other ends of the oxygen free copper thin films 95 and 95' on the substrate 2 at the uppermost level are straightly led to the position of the lowest substrate 2 of reception coil through wires $92_2$ and $92_2'$. This wiring is carried out on the near side of the figure, and they are connected with each other through a wire 93. The other ends of the oxygen free copper thin films 95 and 95' on the substrate 2 at the lowermost level are connected with each other through a wire 94. A transmitting signal is applied to between the wire 93 and the wire 94. In this example, the same reception coils as described with reference to FIG. 3 are used.

Figure 8:
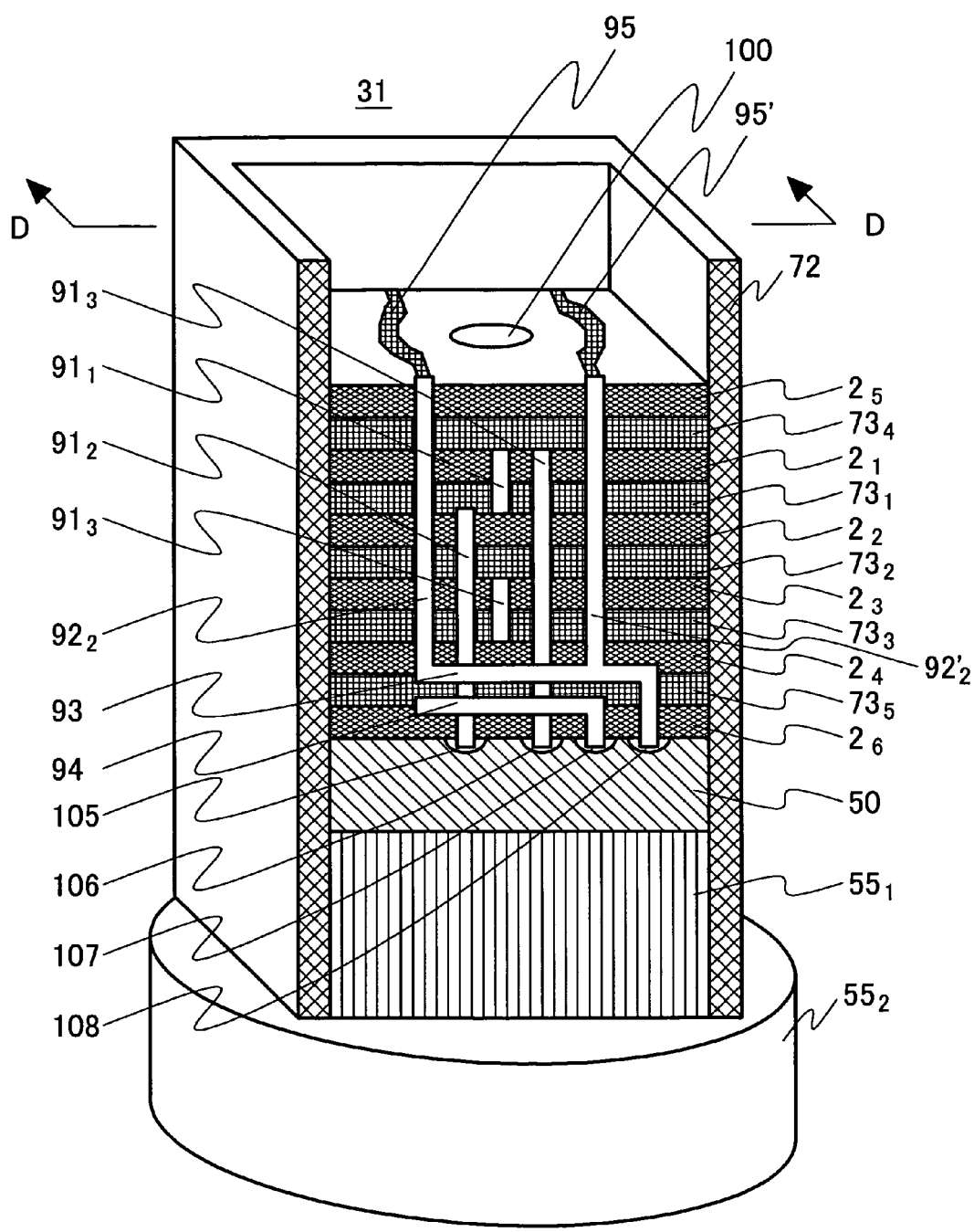
FIG. 8 is a side view of a cryo probe 31 so constructed that the cryo probe is installed in the direction perpendicular to the static magnetic field. The figure illustrates the cryo probe 31 formed by combining transmission coils and reception coils. The figure illustrates the cryo probe with one side face of a fixed substrate 72 for thermal conduction of sapphire removed.
Figure 9:
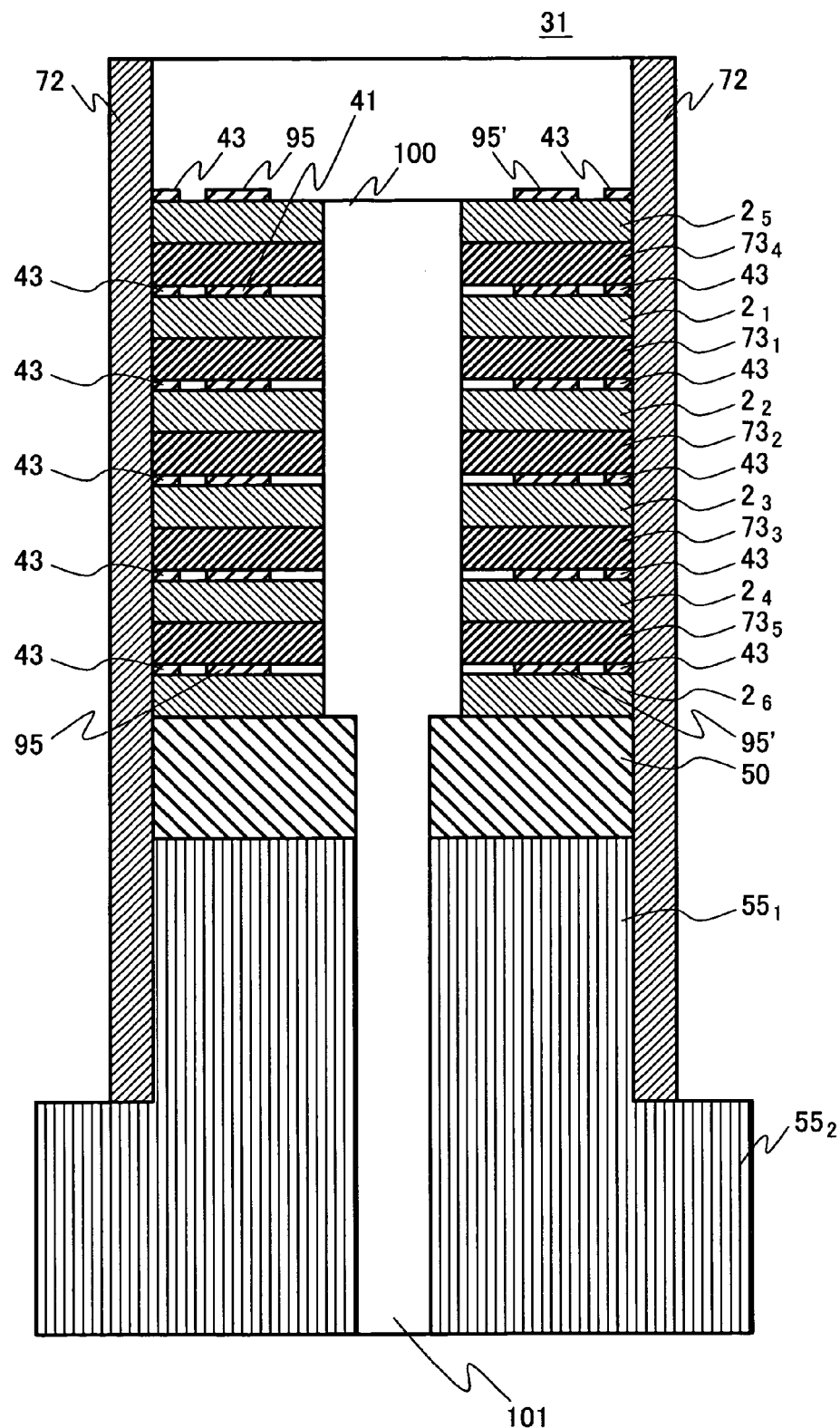
FIG. 9 is a sectional view taken along the line D-D of FIG. 8, as viewed in the direction of the arrows.

FIG. 8 is a side view of a cryo probe 31 so constructed that the cryo probe is installed in the direction perpendicular to the static magnetic field. The figure illustrates the cryo probe 31 formed by combining transmission coils and reception coils. The figure illustrates the cryo probe with one side face of a fixed substrate 72 for thermal conduction of sapphire removed. FIG. 9 is a sectional view taken along the line D—D (at the center of the hole 100 through which a sample tube 32 is to be passed) of FIG. 8, as viewed in the direction of the arrows.

An end $55_1$ of a cold lead 55 of oxygen free copper, connected with an end of a cryocooler, is formed in the same size as substrates 2, and a cold head 50 of sapphire is formed on its upper face. A substrate $2_6$ of sapphire with transmission coils 95 formed thereon is disposed on the upper face of the cold head 50. A substrate $2_4$ of sapphire with an element coil 41 formed thereon is disposed on the upper face of the substrate $2_6$. A substrate $2_3$ of sapphire is disposed on the upper face of the substrate $2_4$ with a spacer substrate $73_3$ of sapphire in-between. Similarly, a substrate $2_2$ of sapphire is disposed on the upper face of the substrate $2_3$ with a spacer substrate $73_2$ of sapphire in-between; and a substrate $2_1$ of sapphire is disposed on the upper face of the substrate $2_2$ with a spacer substrate $73_1$ of sapphire in-between. A substrate $2_5$ of sapphire with transmission coils 95 formed thereon is disposed on the upper face of the substrate $2_1$.

In the process of laminating the substrates 2, the following wires are electrically connected: wires $92_1$ to $92_2'$ that connect together the transmission coils 95 on the substrates and wires for externally leading them out; and wires $91_1$ to $91_4$ that connect together the element coils 41 of the reception coils and wires for externally lading them out.

In the transmission coils, a wire 93 that connects the wires $92_2$ and $92_2'$ and a wire 94 that connects together the ends of the transmission coils 95 formed on the substrate 26 of sapphire on the near side of the figure are connected with the following wires: wires led from cuts 107 and 108 connecting to a lead-out hole 101 formed in the center of the end $55_1$ of the cold lead 55 and the cold head 50. In the reception coils, wires connected with the wires $91_2$ and $91_3$ are connected with wires led from cuts 105 and 106 connecting to the lead-out hole 101 formed in the center of the end $55_1$ of the cold lead 55 and the cold head 50. When connection between the element coils 41 on the substrates 2 and lamination of the substrates 2 are completed, a fixed substrate 72 for thermal conduction is provided. The fixed substrate 72 for thermal conduction encircles the end $55_1$ of the cold lead 55, the cold head 50, and the laminated portions of the substrates 2 and the spacer substrates 73.

In FIG. 8, the representation of the laminated portions of the substrates 2 and the spacer substrates 73 is omitted for avoiding the complication of the figure. However, FIG. 9 shows the following relation in the form of sectional view: the relation between the laminated portions, the substrates 2 and the spacer substrates 73, and the fixed substrate 72 for thermal conduction.

The second embodiment is different from the first embodiment only in that the transmission coils are added at the uppermost and lowermost levels. Therefore, the substrates and spacer substrates are laminated in succession as described with reference to FIG. 5. Thereafter, the laminated portions of the substrates 2 and the spacer substrates 73, the cold head 50, and the end $55_1$ of the cold lead 55 are encircled with the fixed substrate 72 for thermal conduction. The thus constructed cryo probe 31 is heated in an oven at 200° C. to 300° C. for 10 minutes to 30 minutes to fuse the applied indium.

In the configuration in FIG. 8 as well as that in FIG. 5, the fixed substrate 72 for thermal conduction is in contact with the end $55_1$ of the cold lead 55 and the cold head 50. Therefore, the fixed substrate 72 for thermal conduction can be cooled down to 5K. Further, the spacer substrates 73 are inserted into between the substrates 2 with the element coils 41 formed thereon. The substrates 2 are welded together and the substrates 2 and spacer substrates 73 and the fixed substrate 72 for thermal conduction are welded together by indium. This increases the area of contact between the peripheral portions of the substrates 2 and spacer substrates 73 and the fixed substrate 72 for thermal conduction, and efficient cooling can be implemented. As a result, the entire solenoid coil is cooled down to approximately 5K, and the stable operation of the probe coil 40 can be accomplished.

The fabricated probe coil 40 was evaluated at 600 MHz. The result of the evaluation revealed that application of a superconducting thin film enhances the sensitivity by 3.5 times than cases where normal-conducting metal is used. When YBCO was used for the superconducting material with the configuration of the second embodiment as well, the same result was obtained.

(Third Embodiment—Example of Configuration in Which a Cryo Probe 31 is Installed in Parallel with the Static Magnetic Field)

Figure 10A:
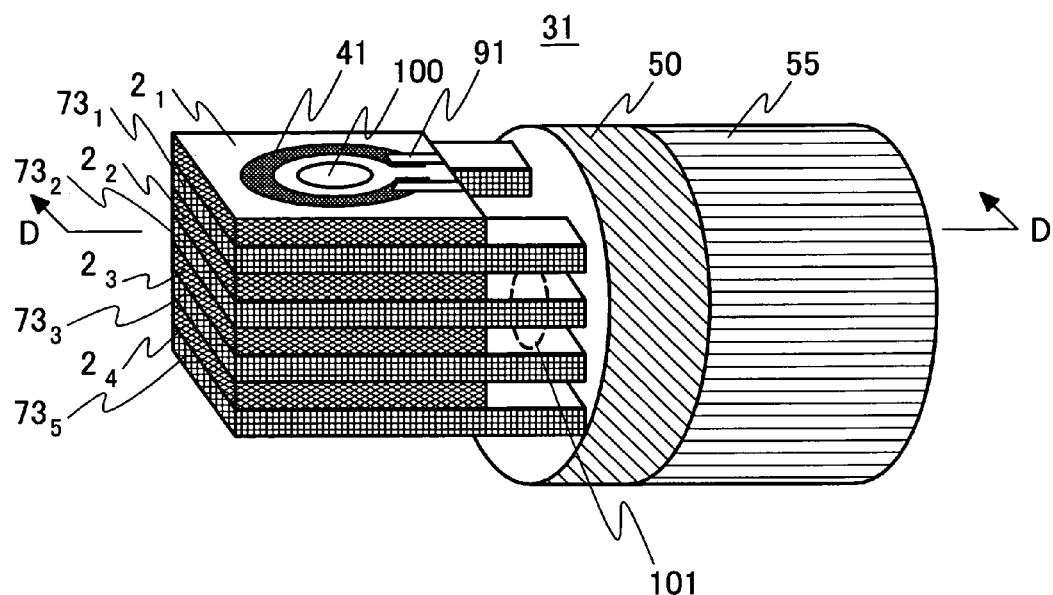
FIG. 10A is a perspective view illustrating a cryo probe 31 coil 40 when the cryo probe 31 is installed in parallel with the static magnetic field.
Figure 10B:
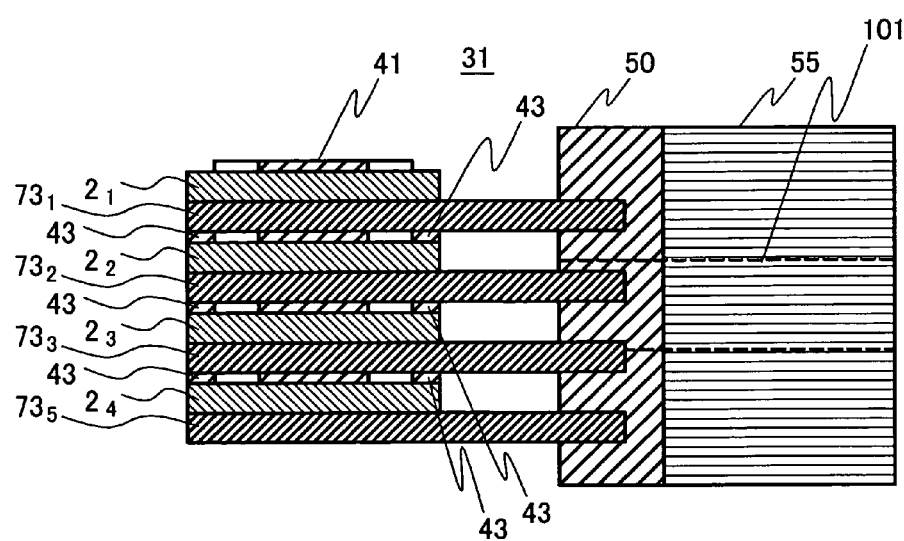
FIG. 10B is a sectional view taken along the line D—D (area where spacer substrates 73 are inserted into a cold head 50) of FIG. 10A.

FIG. 10A is a perspective view illustrating a probe coil 40 with a cryo probe 31 installed in parallel with the static magnetic field. FIG. 10B is a sectional view taken along the line D—D (at the center of an area where spacer substrates 73 are inserted into a cold head 50) of FIG. 10A, as viewed in the direction of the arrows.

The configuration of the cryo probe 31 illustrated in FIGS. 10A and 10B is essentially the same as that of the probe coil 40 illustrated in FIG. 4 with respect to portions related to the layered structure of the spacer substrates 73 and the substrates 2. In this construction in FIG. 10, however, the substrate $2_4$ is not laminated on the upper face of the cold head 50. Therefore, a spacer substrate $73_5$ for transferring cold to the substrate $2_4$ is added to the lower face of the substrate $2_4$. A substrate $2_3$ of sapphire is disposed on the upper face of the substrate $2_4$ with a spacer substrate $73_3$ of sapphire in-between. Similarly, a substrate $2_2$ of sapphire is disposed on the upper face of the substrate $2_3$ with a spacer substrate $73_2$ of sapphire in-between; and a substrate $2_1$ of sapphire is disposed on the upper face of the substrate $2_2$ with a spacer substrate $73_1$ of sapphire in-between. In the process of laminating the substrates 2, wires $91_1$ to $91_4$ that connect together the element coils 41 on the substrates 2 and wires for externally leading them out are electrically connected. Numeral 43 shown between the substrates denotes fused indium.

The cryo probe 31 illustrated in FIGS. 10A and 10B is different from the cryo probe 31 illustrated in FIG. 4 in that: the spacer substrates 73 are extended avoiding the wires $91_1$ to $91_4$ that connect together the element coils 41 on the substrates 2, and inserted into the cold head 50 and fixed there. That is, in order to install the cryo probe 31 in parallel with the static magnetic field, the probe coil 40 is disposed beside the cold head 50 and the cold lead 55. As a result, the cold supplied from a cryocooler is transferred from the cold head 50 to the spacer substrates 73, and then to the substrates 2. Grooves are formed in the cold head 50, and the spacer substrates 73 are inserted into the grooves. In addition, they are additionally welded by indium to enhance the firmness of fixation and the cooling efficiency. Wires for externally leading out the wires $91_1$ to $91_4$ that connect together the element coils 41 on the substrates 2 are led out through a lead-out hole 101 formed in the center of the cold head 50 and the end $55_1$ of the cold leader 55.

As is apparent from FIGS. 10A and 10B, the extended portions of the spacer substrates 73 are fixed as follows: the grooves are formed in the cold head 50, and they are inserted into the grooves. In addition, they are welded by indium to enhance the firmness of fixation and the cooling efficiency. Therefore, the spacer substrates 73 can be cooled down to 5K. As a result, the entire solenoid coil is cooled down to approximately 5K, and the stable operation of the probe coil 40 can be accomplished.

The fabricated probe coil 40 was evaluated at 600 MHz. The result of the evaluation revealed that as in the first embodiment, application of a superconducting thin film enhances the sensitivity by 3.5 times than cases where normal-conducting metal is used. When YBCO was used for the superconducting material with the configuration of the second embodiment as well, the same result was obtained.

(Fourth Embodiment—Example of Configuration in Which a Cryo Probe 31 is Installed in Parallel with the Static Magnetic Field)

Figure 11:
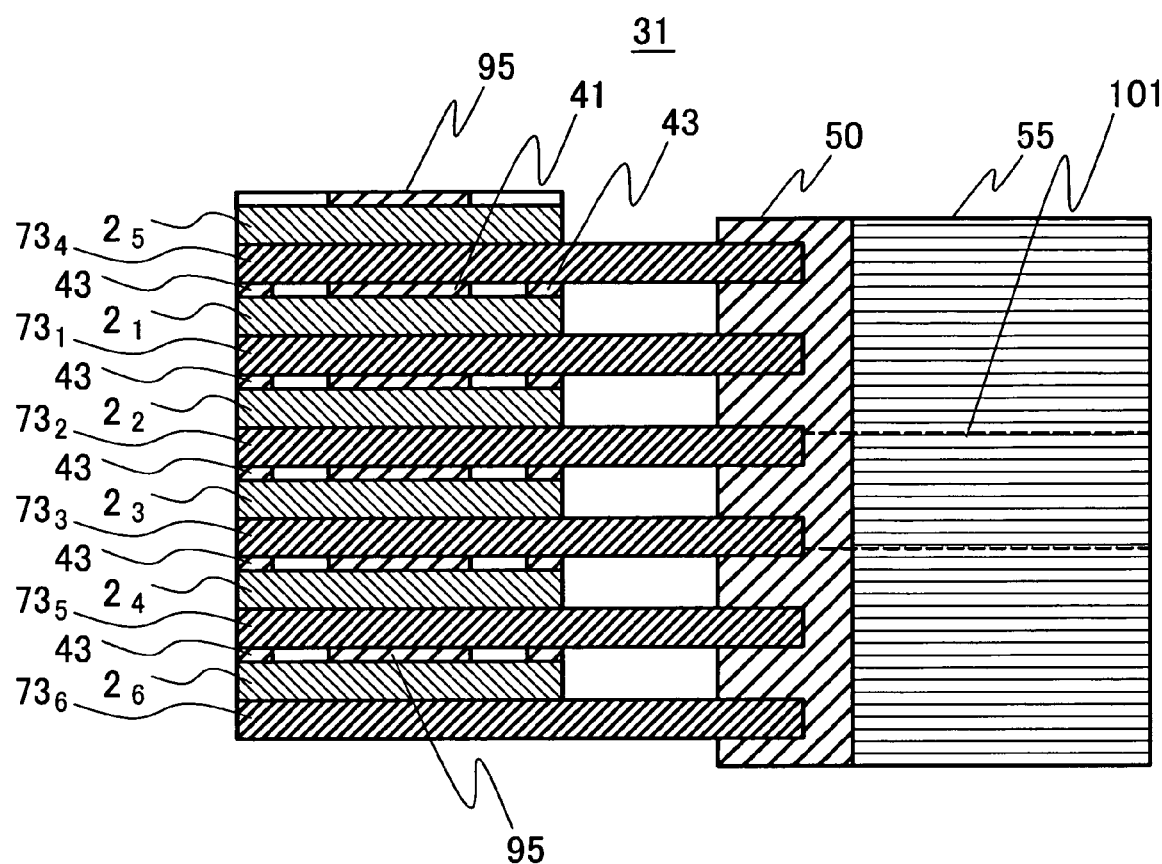
FIG. 11 is a sectional view illustrating a cryo probe 31 so constructed that it is installed in the direction perpendicular to the static magnetic field, illustrated in FIG. 9. The figure illustrates the cryo probe 31 formed by combining transmission coils and reception coils.

FIG. 11 is a sectional view illustrating a cryo probe 31 so constructed that it is installed in the direction perpendicular to the static magnetic field illustrated in FIG. 9. The figure illustrates the cryo probe 31 formed by combining transmission coils and reception coils. Here, a perspective view corresponding to FIG. 10A is omitted.

As is apparent from the comparison with FIG. 10B, the cryo probe 31 illustrated in FIG. 11 is the same as a cryo probe 31 including a probe coil 40 having no transmission coil except the following: the substrate $2_5$ with the pattern 95 of upper-face transmission coil formed thereon is provided on the upper face of the sapphire substrate $2_1$ of a reception coil; and the substrate $2_6$ with the pattern 95 of lower-face transmission coil formed thereon is provided on the lower face of the sapphire substrate $2_4$ of a reception coil. A spacer substrate $73_4$ is provided between the substrate $2_5$ with the pattern 95 of upper-face transmission coil formed thereon and the upper face of the sapphire substrate $2_1$ of the reception coil. A spacer substrate $73_5$ is provided between the substrate $2_6$ with the pattern 95 of lower-face transmission coil formed thereon and the lower face of the sapphire substrate $2_4$ of the reception coil. Further, a spacer substrate $73_6$ is provided on the lower face of the substrate $2_6$ with the pattern 95 of lower-face transmission coil formed thereon. The following wires are led out through a lead-out hole 101 formed in the center of the cold head 50 and the end $55_1$ of the cold lead 55: wires for externally leading out wires $91_1$ to $91_4$ that connect together the element coils 41 on the substrates 2 of reception coils; and wires for externally leading out the wires 93 and 94 of the transmission coils. Numeral 43 shown between the substrates denotes fused indium.

As is apparent from FIG. 11, grooves are formed in the cold head 50, and the extended portions of the spacer substrates 73 are inserted into the grooves. In addition, they are additionally welded by indium to enhance the firmness of fixation and the cooling efficiency. Therefore, the spacer substrates 73 can be cooled down to 5K. As a result, the entire solenoid coil is cooled down to approximately 5K, and the stable operation of the probe coil 40 can be accomplished.

The fabricated probe coil 40 was evaluated at 600 MHz. The result of the evaluation revealed that application of a superconducting thin film enhances the sensitivity by 3.5 times than cases where normal-conducting metal is used.

In the fourth embodiment, YBCO was used for the superconducting thin film material. When $MgB_2$ was used for the superconducting thin film material with the same configuration as well, the same result was obtained.

(Fifth Embodiment—Example of Configuration in Which a Cryo Probe 31 is Installed in Parallel with the Static Magnetic Field)

Figure 12A:
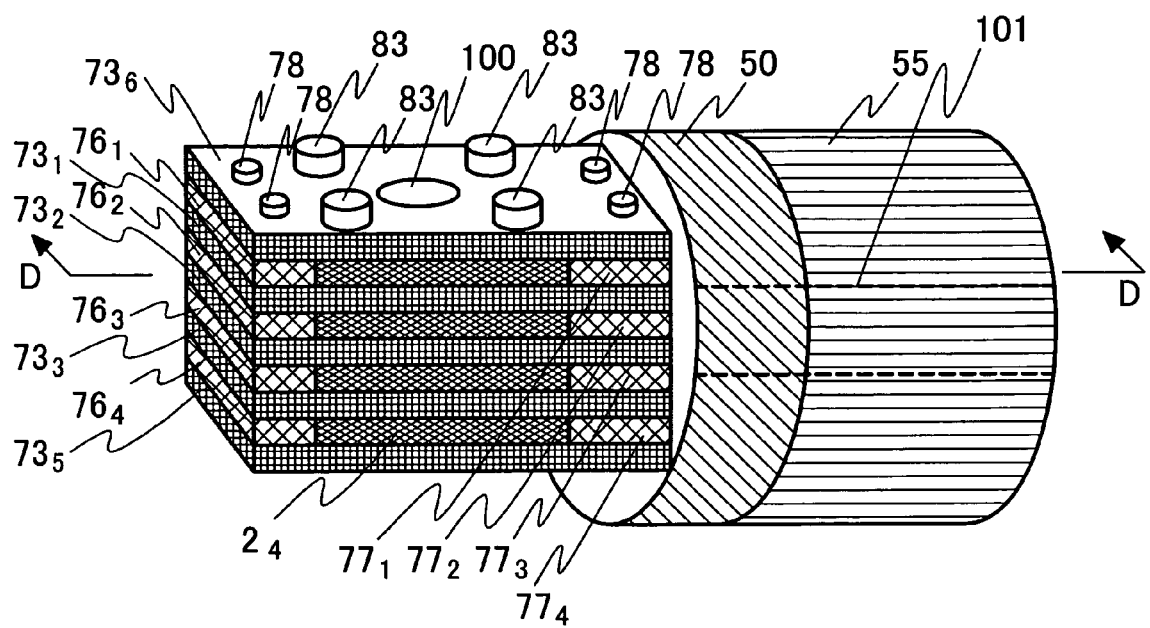
FIG. 12A is a perspective view illustrating a probe coil 40 when a cryo probe 31 is installed in parallel with the static magnetic field.
Figure 12B:
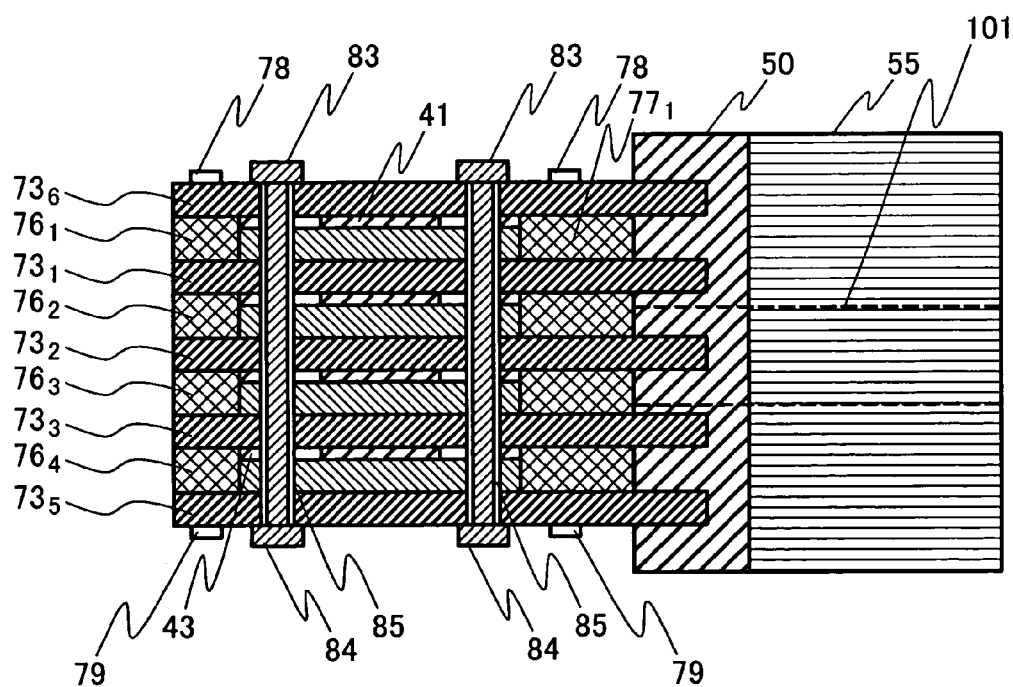
FIG. 12B is a sectional view taken along the line D—D (area where spacer substrates 73 are inserted into a cold head 50) of the FIG. 12A.

FIG. 12A is a perspective view illustrating a probe coil 40 when a cryo probe 31 is installed in parallel with the static magnetic field. FIG. 12B is a sectional view taken along the line D—D (area where spacer substrates 73 are inserted into a cold head 50) of FIG. 12A.

The configurations of the portions related to the layered structure of the spacer substrates 73 and substrates 2 illustrated in FIGS. 12A and 12B are essentially the same as those in the probe coil 40 illustrated in FIGS. 10A and 10B. However, a spacer substrate $73_6$ of sapphire is also laminated on the upper face of the substrate $2_1$. In addition, the spacer substrates 73 are also extended on the side opposite to the cold head 50, and further, spacers 76 and 77 of sapphire having the same thickness as that of the substrates 2 of sapphire are provided on both sides of the substrates 2. The end faces of the spacers 76 agree with the end faces of the spacer substrates 73. The spacers 77 are inserted into between the end faces of the substrates 2 and an end face of the cold head 50. When the spacer substrates 73 are laminated, these spacers 76 and 77 are simultaneously laminated on both sides of them. Numerals 78 and 79 denote bolts and nuts of polytetrafluoroethylene provided between the spacer substrate $73_6$ and the spacer substrate $73_5$ and in the laminated portions of the spacers 76 between them. Numerals 83 and 84 denote bolts and nuts of polytetrafluoroethylene provided between the spacer substrates $73_6$ and the spacer substrate $73_5$ and in the laminated portions of the substrates 2. Numeral 85 denotes a through hole for the bolts 83. The area between the spacer substrate $73_6$ and the spacer substrate $73_5$ and the laminated portions of the spacers 76 are firmly tightened with the bolts 78 and nuts 79. Further, the area between the spacer substrate $73_6$ and the spacer substrate $73_5$ and the laminated portions of the substrates 2 are firmly tightened with the bolts 83 and nuts 84. As a result, the mechanical strength of the probe coil 40 can be enhanced. The bolts and nuts formed of polytetrafluoroethylene material may be formed of sapphire material or aluminum nitride material, instead. Where the bolts and nuts are formed of polytetrafluoroethylene material, sapphire material, or aluminum nitride material, such a configuration that wires for electrical connection with an external circuit are fixed with these bolts and nuts can be adopted. The figures show indium fused between the substrates. However, numeral 43 is given to only one area of fused indium for avoiding the complication of the figures. The thus constructed solenoid coil is heated in an oven at 200° C. to 300° C. for 10 minutes to 30 minutes to fuse the applied indium. Last, the solenoid coil is welded to an end of a cryocooler by indium to obtain the cryo probe 31.

In this embodiment, when the hole 100 through which a sample tube is to be passed is formed, the spacer substrates 73, substrates 2, spacers 76, and spacers 77 are perforated to form bolt through holes 85.

The performance of the probe coil 40 in the fifth embodiment is essentially the same as that in the fourth embodiment. However, the thermal conduction effect of the spacers 76 and 77 of sapphire improves the balance of cooling the element coils 41 on the substrates 2. As a result, the performance is further enhanced.

The fabricated probe coil 40 was evaluated at 600 MHz. The result of the evaluation revealed that as in the fourth embodiment, application of a superconducting thin film enhances the sensitivity by 3.5 times than cases where normal-conducting metal is used. When YBCO was used for the superconducting material with the configuration of the fifth embodiment as well, the same result was obtained.

In the fifth embodiment, YBCO was used for the superconducting thin films 41 and sapphire was used for the substrates 2 and the spacer substrates 73. If $MgB_2$ is used for the superconducting thin film, aluminum nitride AlN can be used for the material of the substrates 2. In this case, the substrates 2 and the spacer substrates 73 can be all formed of AlN.

(Sixth Embodiment—Example of Configuration in Which a Cryo Probe 31 is Installed in Parallel with the Static Magnetic Field)

Figure 13:
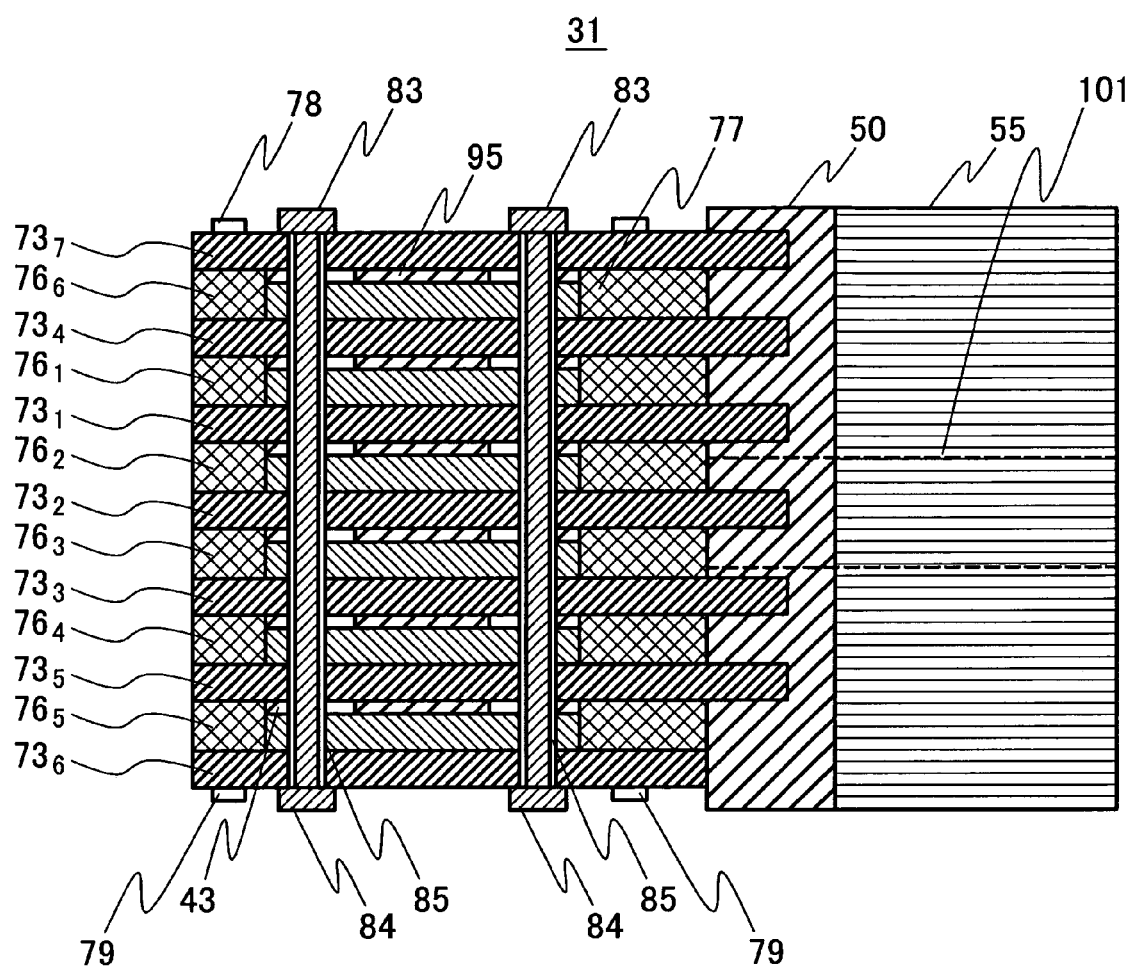
FIG. 13 is a sectional view of a cryo probe 31 so constructed that it is installed in parallel with the static magnetic field. The figure illustrates the cryo probe 31 formed by combining transmission coils and reception coils.

FIG. 13 is a sectional view of a cryo probe 31 so constructed that it is installed in parallel with the static magnetic field. The figure illustrates the cryo probe 31 formed by combining transmission coils and reception coils. Here, a perspective view corresponding to FIG. 12A is omitted.

The configurations of the portions related to the layered structure of the spacer substrates 73 and substrates 2 illustrated in FIG. 13 are essentially the same as those in the probe coil 40 illustrated in FIG. 11. However, a spacer substrate $73_7$ of sapphire is laminated on the upper face of the substrate $2_5$. In addition, a spacer substrate $73_6$ of sapphire is laminated on the lower face of the substrate $2_6$. The spacer substrates 73 are also extended on the side opposite to the cold head 50, and further, spacers 76 and 77 of sapphire having the same thickness as that of the substrates 2 of sapphire are provided on both sides of the substrates 2 of sapphire. The end faces of the spacers 76 agree with the end faces of the spacer substrates 73. The spacers 77 are inserted into between the end faces of the substrates 2 and an end face of the cold head 50. The constructing procedure is also the same as for the fifth embodiment described with reference to FIGS. 12A and 12B. Numerals 78 and 79 denote bolts and nuts of polytetrafluoroethylene provided between the spacer substrate $73_7$ and the spacer substrate $73_6$ and in the laminated portions of the spacers 76 located between them. Numerals 83 and 84 denote bolts and nuts of polytetrafluoroethylene provided between the spacer substrate $73_7$ and the spacer substrate $73_6$ and in the laminated portions of the substrate 2. Numeral 85 denotes a through hole for the bolts 83. The area between the spacer substrate $73_7$ and the spacer substrate $73_6$ and the laminated portions of the spacers 76 are firmly tightened with the bolts 78 and nuts 79. Further, the area between the spacer substrate $73_7$ and the spacer substrate $73_6$ and the laminated portions of the substrates 2 are firmly tightened with the bolts 83 and nuts 84. As a result, the mechanical strength of the probe coil 40 can be enhanced. The figure shows indium fused between the substrates. However, numeral 43 is given to only one area of fused indium for avoiding the complication of the figure. The thus constructed solenoid coil is heated in an oven at 200° C. to 300° C. for 10 minutes to 30 minutes to fuse the applied indium. Last, the solenoid coil is welded to an end of a cryocooler by indium to obtain the cryo probe 31.

The performance of the probe coil 40 in the sixth embodiment is essentially the same as that in the fourth embodiment. However, the thermal conduction effect of the spacers 76 and 77 of sapphire improves the balance of cooling the element coils 41 on the substrates 2. As a result, the performance is further enhanced.

The fabricated probe coil 40 was evaluated at 600 MHz. The result of the evaluation revealed that as in the fifth embodiment, application of a superconducting thin film enhances the sensitivity by 3.5 times than cases where normal-conducting metal is used. When YBCO was used for the superconducting material with the configuration of the sixth embodiment as well, the same result was obtained.

According to the present invention, an NMR measuring apparatus wherein a solenoid superconducting probe coil applicable to split magnets can be inserted in the direction perpendicular to or parallel with the static magnetic field can be realized. In this apparatus, a superconducting and yet solenoid probe coil can be materialized. As a result, the thermal noise and the surface resistance can be reduced and the sensitivity can be enhanced through application of a superconducting thin film. Because of the shape of the solenoid coil, the filling factors of samples are enhanced, and this results in the enhanced sensitivity.

According to the present invention, high-sensitivity, high-resolution NMR measurement can be carried out, and protein structures can be analyzed with higher accuracy.

What is claimed is:

1. A nuclear magnetic resonance apparatus comprising:
   a means for generating a predetermined uniform magnetic field; and
   a probe that is disposed in the magnetic field and into and from which a sample tube holding a sample to be measured can be inserted and withdrawn,
   wherein the magnetic field generating means comprises two split superconducting magnets, and the probe is inserted in the direction perpendicular to or parallel with the direction of the magnetic field generated by the superconducting magnets,
   wherein the probe is provided with: a layered structure of the plurality of substrates having a one-turn coil, obtained by processing a superconducting thin film, formed on the surfaces thereof, and spacer substrates provided between the substrates; and a probe coil formed in solenoid type by connecting the coils on the plurality of substrates, obtained by processing a superconducting thin film, in serial, parallel, or serial parallel, and
   wherein the spacer substrates are cooled directly or indirectly by a cold head coupled with a cryo cooling system.

2. The nuclear magnetic resonance apparatus according to claim 1,
   wherein, when the probe is provided so that the probe is inserted in the direction perpendicular to the direction of the magnetic field generated by the superconducting magnets, the spacer substrates are cooled directly by the cold head coupled with the cryo cooling system.

3. The nuclear magnetic resonance apparatus according to claim 1,
   wherein, when the probe is provided so that the probe is inserted in the direction parallel with the direction of the magnetic field generated by the superconducting magnets, the spacer substrates are cooled through a fixed substrate for thermal conduction cooled directly by the cold head coupled with the cryo cooling system.

4. The nuclear magnetic resonance apparatus according to claim 3,
   wherein in the layered structure of the plurality of substrates having a one-turn coil, obtained by processing a superconducting thin film, formed on the surface thereof and the spacer substrates provided between the substrates, the spacer substrates are extended on both sides of the plurality of substrates having a one-turn coil formed on the surface thereof, and
   wherein a spacer is inserted into between the extended spacer substrates.

5. The nuclear magnetic resonance apparatus according to claim 4,
   wherein in the layered structure of the plurality of substrates having a one-turn coil, obtained by processing a superconducting thin film, formed on the surface thereof and the spacer substrates provided between the substrates, a spacer substrate is added to the uppermost face of the plurality of substrates,
   wherein the spacer substrates are extended on both sides of the plurality of substrates having a one-turn coil, obtained by processing a superconducting thin film, formed on the surface thereof, and
   wherein a spacer is inserted into between the extended spacer substrates, and the area between the uppermost spacer substrate and the lowermost spacer substrate is tightened with bolts and nuts.

6. The nuclear magnetic resonance apparatus according to claim 1,
   wherein in addition to the probe coil formed in solenoid type by connecting the coils on the plurality of substrates, obtained by processing a superconducting thin film, in serial, parallel, or, serial parallel, the probe is provided with substrates with transmission coils formed thereon on the upper and lower faces of the probe coil, and
   wherein the coils on the substrates with the transmission coils formed thereon are connected together in saddle type to obtain a probe coil constructed in solenoid type.

7. The nuclear magnetic resonance apparatus according to claim 6,
   wherein the lead-out wires of the coils connected in saddle type are led out through another cut formed in the cold head and the bore in the cold head.

8. The nuclear magnetic resonance apparatus according to claim 1,
   wherein the connection between the coils on the substrates of the probe coil formed in solenoid type by connecting the coils on the plurality of substrates, obtained by processing a superconducting thin film, in serial, parallel, or, serial parallel is carried out on the side faces of the substrates, and
   wherein the lead-out wires of the coils are led out through a cut formed in the cold head and the bore in the cold head.

9. The nuclear magnetic resonance apparatus according to claim 1,
   wherein the serial, parallel, or, serial-parallel connection of the coils on the plurality of substrates, obtained by processing a superconducting thin film, is connected with wires through capacitors formed at the ends of the individual coils.

10. A probe applied to a nuclear magnetic resonance apparatus comprising:
    a means for generating a predetermined uniform magnetic field by two split superconducting magnets; and
    a probe that is disposed in the magnetic field and into and from which a sample tube holding a sample to be measured can be inserted and withdrawn,
    the probe being so constructed that the probe is inserted in the direction perpendicular to or parallel with the direction of the magnetic field generated by the superconducting magnets,
    the probe being provided with: a layered structure of the plurality of substrates having a one-turn coil, obtained by processing a superconducting thin film, formed on the surface thereof, and spacer substrates provided between the substrates; and a probe coil formed in solenoid type by connecting the coils on the plurality of substrates, obtained by processing a superconducting thin film, in serial, parallel, or, serial parallel,
    wherein the spacer substrates are cooled directly or indirectly by a cold head coupled with a cryo cooling system.

11. The probe according to claim 10, so provided that the probe is inserted in the direction perpendicular to the direction of the magnetic field generated by the superconducting magnets, wherein the spacer substrates are cooled directly by the cold head coupled with the cryo cooling system.

12. The probe according to claim 10, so provided that the probe is inserted in the direction parallel with the direction of the magnetic field generated by the superconducting magnets, wherein the spacer substrates are cooled through a fixed substrate for thermal conduction cooled directly by the cold head coupled with the cryo cooling system.

13. The probe according to claim 12, wherein the lead-out wires of the coils connected in saddle type are led out through another cut formed in the cold head and the bore in the cold head.

14. The probe according to claim 10, provided with: in addition to the probe coil formed in solenoid type by connecting the coils on the plurality of substrates, obtained by processing a superconducting thin film, in serial, parallel, or, serial parallel, substrates with transmission coils formed thereon on the upper and lower faces of the probe coil, wherein the coils on the substrates with the transmission coils formed thereon are connected together in saddle type to obtain a probe coil constructed in solenoid type.

15. The probe according to claim 10, wherein the connection between the coils on the substrates of the probe coil formed in solenoid type by connecting the coils on the plurality of substrates, obtained by processing a superconducting thin film, in serial, parallel, or, serial parallel is carried out on the side faces of the substrates, and wherein the lead-out wires of the coils are led out through a cut formed in the cold head and the bore in the cold head.

* * * * *